United States Patent [19]

Emken et al.

[11] Patent Number: 5,328,713

[45] Date of Patent: Jul. 12, 1994

[54] PRECISE REGULATION OF FLUIDIZED BED WEIGHT IN PYROLYTICALLY COATING SUBSTRATES

[75] Inventors: Michael R. Emken, Austin; James A. Accuntius, Georgetown; David S. Wilde, Austin, all of Tex.

[73] Assignee: Carbon Implants, Inc., Austin, Tex.

[21] Appl. No.: 32,627

[22] Filed: Mar. 16, 1993

[51] Int. Cl.$^5$ ............................................. C23C 16/52
[52] U.S. Cl. ..................................... 427/8; 427/213; 427/249; 427/255.2; 118/303; 118/712; 118/716; 118/DIG. 5
[58] Field of Search ..................... 427/213, 249, 255.2, 427/8; 118/303, 712, 716, DIG. 5

[56] References Cited

U.S. PATENT DOCUMENTS

| | | | |
|---|---|---|---|
| 3,399,969 | 9/1968 | Bokros et al. | 23/209.1 |
| 3,707,006 | 12/1972 | Bokros et al. | 427/223 |
| 3,977,896 | 8/1976 | Bokros et al. | 427/213 |
| 4,546,012 | 10/1985 | Brooks | 427/213 |
| 4,594,270 | 6/1986 | Brooks | 427/213 |

FOREIGN PATENT DOCUMENTS 0055406 3/1985 European Pat. Off. .

Primary Examiner—Terry J. Owens
Attorney, Agent, or Firm—Fitch, Even, Tabin & Flannery

[57] ABSTRACT

Precise control of pyrocarbon being coated upon an object in a fluidized particle bed is achieved by monitoring the weight change of the fluidized particle bed over a period of time. Measurement of such weight change is truly representative of bed size in such a coater, which is a most important factor in achieving the desired characteristics of the pyrocarbon being deposited. By monitoring the bed size by repeatedly determining such changes in the weight, compensating adjustments are made by either adding additional particles to the bed or by changing the rate at which particles are withdrawn so that precise coating characteristics are achieved, and coatings can be deposited within very close thickness tolerances.

20 Claims, 1 Drawing Sheet

PRECISE REGULATION OF FLUIDIZED BED WEIGHT IN PYROLYTICALLY COATING SUBSTRATES

This application relates to the deposition of a substance, such as pyrolytic carbon, onto a substrate being levitated in a fluidized bed of particles, and it more specifically relates to processes and apparatus for very carefully controlling pyrolytic deposition, particularly in instances where the density of the substance being deposited is less than the density of the particles that make up the particulate bed that is being levitated.

BACKGROUND OF THE INVENTION

Pyrolytic carbon may be deposited by thermally decomposing gaseous hydrocarbons or other carbonaceous substances in vaporous form in the presence of a substrate whereupon the deposition will take place. It is well known to coat substrates with layers of pyrolytic carbon for various different purposes. In this respect, the coating may oftentimes completely envelop the substrate, and the composite coated substrate may be the desired end product. In other instances, a disposable object or mandrel may be used as the substrate and be coated with a fairly thick layer of pyrolytic carbon; subsequently, the mandrel is machined away or otherwise removed whereby the monolithic coating becomes the desired end product, e.g., European Patent No. 0 055 406, inventors: Bokros et al., incorporated herein by reference. The present invention is suitable for use with all such instances, even if the underlying substrate is eventually removed.

When pyrolytic carbon is deposited in a fluidized bed apparatus, one of the variables upon which the structure of the pyrolytic carbon will be dependent is the available deposition surface area, relative to the volume of the furnace enclosure wherein the deposition is occurring. Pyrolytic carbon which has a microstructure that is free of growth features will be deposited when the relative amount of deposition surface area is fairly high. Thus, when relatively large objects, for example, objects having at least one dimension equal to 5 mm or more, are being coated, an ancillary bed of small particles (usually of a size measured in hundreds of microns) are included within the furnace enclosure together with the larger object or objects. This arrangement provides sufficient available total surface area to assure that pyrolytic carbon having the desired crystalline form will be deposited. In addition, the random motion of large objects in fluidized beds provide for a relatively uniform deposition of carbon on all surfaces.

However, whenever such submillimeter particles are being coated in a fluidized bed, the total surface area of the particles begins to increase significantly as the diameters of the pyrolytic carbon-coated particles grow. This change in the available deposition surface area in the fluidized bed will result in a change in the physical characteristics of the pyrolytic carbon being deposited if the other coating variables are held constant, e.g., coating temperature, gas flow rate and gas composition; and moreover, when the bed reaches some maximum size, it will collapse and thus limit the thickness of the carbon coating that can be deposited on levitated substrates under constant conditions. Changes in the physical characteristics of the carbon deposited may be undesirable for any of a number of reasons.

It has been found that pyrolytic carbon having good structural strength and uniform physical properties can be deposited as relatively thick coatings upon relatively large objects in the accompaniment of particles if the available fluidized bed surface area is maintained relatively constant by withdrawing particles which have become enlarged in size as a result of coating and feeding smaller size particles into the deposition enclosure. Very generally, the availability of a relatively large amount of deposition surface area in a furnace enclosure of a given volume facilitates the efficient deposition of pyrolytic carbon which is either isotropic or laminar in microstructure and without growth features. In contrast when carbon is deposited on a fixed substrate (e.g., a mandrel) in a chamber without a bed of particles, large gradients in gas composition are established at the gas-solid interfaces where the deposition is occurring, and growth features develop in the microstructure of the deposited carbon. Illustrations and theoretical considerations are reviewed in J. C. Bokros, "The Preparation, Structure, and Properties of Pyrolytic Carbon," in *Chemistry and Physics of Carbon*, Vol. 5, P. L. Walker (ed.) Marcel Dekker, New York, 1969, Chapter 1.

The crystalline structure, the density and other physical properties, such as the coefficient of thermal expansion, of pyrolytic carbon deposited by the thermal decomposition of a vaporous carbonaceous substance are dependent upon several independently variable operating conditions within the coating apparatus being employed. These conditions include the temperature of the substrate surfaces upon which the deposition is occurring, the overall chemical composition of the atmosphere from which deposition is occurring, the partial pressure of the vaporous carbonaceous substance, the surface area to volume ratio in the active deposition region of the coating apparatus, and the contact time (a parameter based upon the gas flow rate and cross sectional area of the furnace enclosure). Although various of these conditions can be easily regulated and therefore maintained at a constant desired value in many different types of coating apparatus, the surface area to volume ratio is inherently subject to constant change because there is a continuous gradual increase in the total surface area as the items being coated grow in size as the result of the deposition thereupon. When a bed of small spheroids or the like, having an average size between about 50 microns and 600 microns, is present in the active deposition surface region (either because they are the products being coated, e.g., in the case of nuclear fuel particles, or because they are associated with other objects being coated so as to increase the total surface area to void volume ratio), such small particles increase relatively rapidly in surface area as the diameters of these particles grow during deposition of pyrolytic carbon.

A desired surface area to volume ratio is initially provided by starting with an appropriate amount of particles of a particular average size to constitute the fluidized bed. Preferably, an initial surface area to volume ratio is provided near the lower end of the range that produces crystalline pyrolytic carbon having the physical properties desired. Thereafter, as the growing thickness of the deposited pyrolytic carbon layers causes the total surface area to increase, withdrawal of some of the coated particles is initiated so as to decrease the total number of particles to thereby maintain a specific surface area or to regulate its increase in a controlled manner, and replacement of the particles being withdrawn with particles of much smaller size is also begun.

In coating operations where it is desirable to employ a relatively large surface area to volume ratio, a coating apparatus is of course employed that can maintain such a bed of particles in motion and in association with any larger objects that may also be coated. Examples of suitable coating apparatus of this type include, fluidized bed coaters and rotating drum coaters.

One example of a suitable coating apparatus is shown in Bokros, et al. U.S. Pat. No. 3,399,969 incorporated herein by reference, which points out that the pyrocarbon coating of relatively large objects, such as objects having a dimension of about 5 millimeters or greater, in the presence of an ancillary bed of small particles (i.e. of a size measured in tens or hundreds of microns), is best controlled by controlling the available deposition surface area relative to the volume of the coating enclosure wherein the actual deposition is taking place.

In Bokros and Akins U.S. Pat. No. 3,977,896 and Akins, incorporated herein by reference, an improved process was described and illustrated for depositing pyrolytic carbon coatings of substantial thickness which would have a very uniform crystallinity throughout the entire thickness of the pyrocarbon deposited. Such uniformity was achieved by maintaining the total deposition surface area within the coating enclosure relatively constant by adding particles of small size to the coater while coated particles (which have grown in size) are being removed from the enclosure at a controlled rate by regulating the rate of flow of an inert gas stream upward through a conduit through which the particles exit.

Subsequent to the issuance of the '896 patent, Brooks U.S. Pat. No. 4,546,012 incorporated herein by reference, which teaches an improved fluidized bed apparatus for coating such a relatively large object in association with a bed of particles being levitated, which maintains a constant bed size from a volumetric standpoint by employing a weir tube having a spillover entrance hole to define the maximum upper level of the fluidized bed by its location at a desired vertical level within the coating enclosure. Preferably the weir tube is closed at its top and has its spillover hole facing away from the centerline of the coating enclosure. Sufficient purge flow of inert gas upward through the tube is maintained so as to prevent any substantial quantity of dust from gravitating down the tube with the coated particles being withdrawn. Brooks U.S. Pat. No. 4,594,270 incorporated herein by reference, and shows an apparatus for removing particles from a desired level within such a fluidized bed within which a larger object is being levitated and coated by pyrolytic decomposition. This patent teaches the employment of a vertically slidable sampling tube, preferably controlled from the exterior of the furnace, which can be located so as to have its opening at a desired vertical level from which the sample is to be withdrawn. Flow of inert gas through the sampling tube is controlled so as to selectively allow particles to be withdrawn from the bed when the tube is at the desired vertical level.

Although the foregoing patents disclose acceptable processes for controlling pyrolytic deposition within a fluidized bed system, it is extremely difficult, if not impossible, to determine the actual size of the bed surface area at any moment, and as coating processes become more sophisticated, there is a desire to be able to even more precisely control the characteristics of the pyrocarbon being deposited. As a result, more improved methods of control have been sought.

SUMMARY OF THE INVENTION

It has been found that the deposition of pyrocarbon or a similar substance onto a substrate being levitated in a fluidized bed of particles can be very precisely controlled by monitoring the weight of the bed during the deposition process. By determining the change in weight over a period of time, the surface area within the bed can be appropriately changed in response to such monitored weight change. Such surface area change is effected either by changing the rate at which particles are being withdrawn from the bed or the rate at which particles are being fed into the bed, or both. As a result, the characteristics of the pyrocarbon or other substance being deposited can be controlled in a very precise manner, for example, to maintain extreme uniformity of the pyrocarbon being deposited and/or to achieve a precise thickness of the deposit. Such control may also be used to change the character of the pyrocarbon being deposited in a programmed manner; for instance, pyrocarbon of a first character might be deposited at the beginning of a coating operation and pyrocarbon of a different character deposited during a subsequent part of such coating operation.

DETAILED DESCRIPTION

Figures 1, 2:
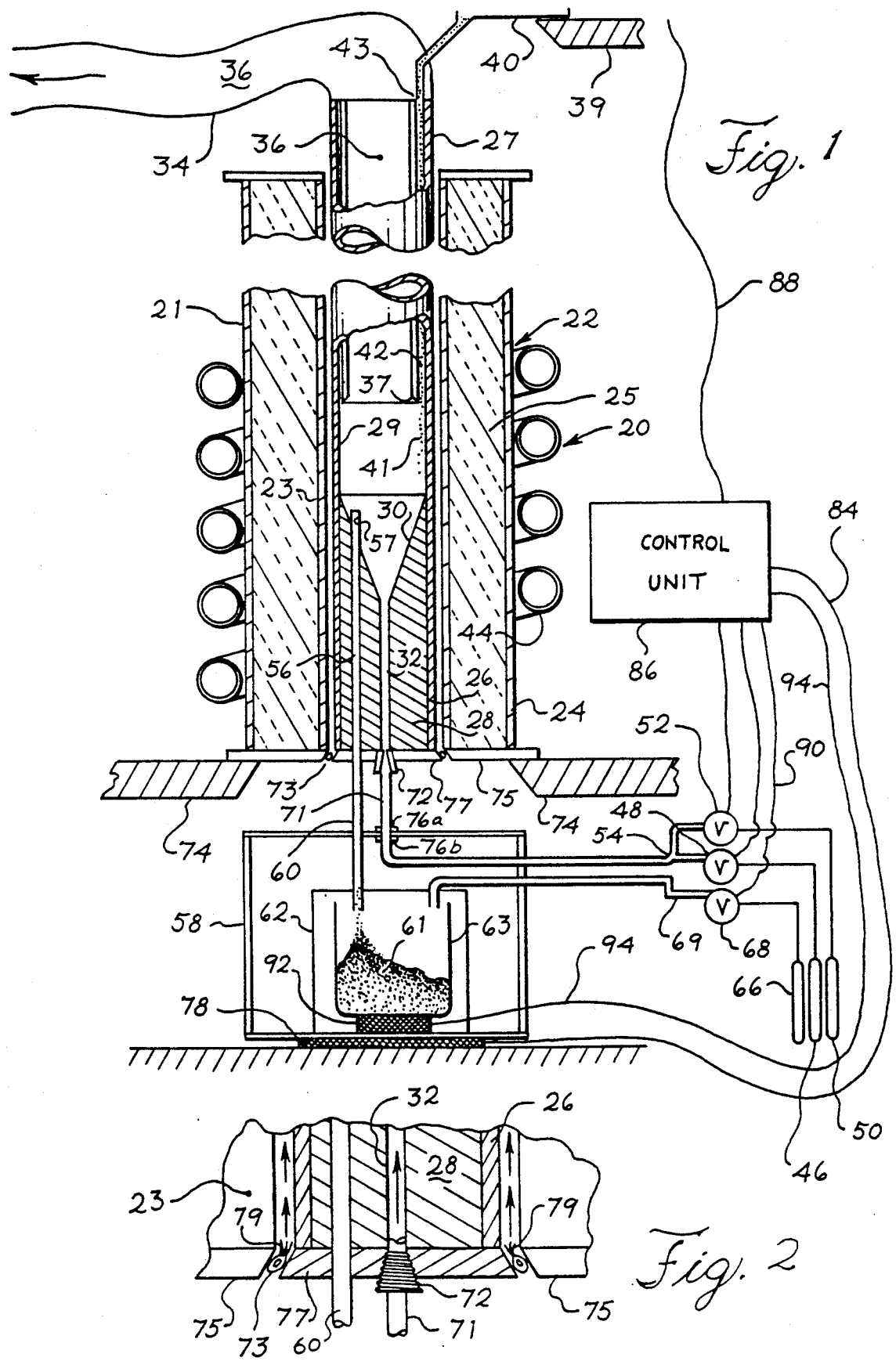
FIG. 1 is a schematic view, partially in section, of a fluidized bed apparatus for depositing pyrolytic coatings upon objects being levitated in association with a bed of particles embodying various features of the present invention, together with associated control mechanism for the operation thereof.
FIG. 2 is a partial schematic view of the fluidized bed apparatus of FIG. 1 showing a sectional view of an annular seal suitable for use with the present invention.

Illustrated in the FIG. 1 is a suitable fluidized bed coating apparatus 20 which includes a furnace 22 having an outer annular heating section 21 which surrounds a coating enclosure 29. The coating enclosure 29 is separated from the surrounding annular heating section 21, which includes an outer quartz tube 24 which confines a layer of insulation 25 between it and a graphite inner susceptor tube 23, and is defined generally by a central furnace tube 26 which interconnects with an upper stack 27 and a lower nozzle 28. The lower nozzle 28 mates with the bottom end of the furnace tube 26 and provides the coating enclosure with a conical bottom surface 30; it includes a central passageway 32 that extends vertically upward therethrough and is preferably coaxial with the furnace tube 26 which is of circular cross-section. Although there should be no size limitations on such coaters, of general interest are coaters having furnace tubes 26 not greater than about a foot in diameter and particularly those having an interior diameter of about 6 inches or less. The levitating atmosphere flows upward through this passageway 32 to enter the coating enclosure.

An exit passageway 36 from the coating enclosure is defined by a flexible exhaust duct 34 or the like that extends downward onto the furnace 22. The hot levitating and coating gases leaving the fluidized bed coater pass through this upper exit passageway 36 and flow via the flexible exhaust duct 34 leading to an appropriate vent (not shown). Preferably, the vent arrangement is independently supported so that very little or substantially none of the weight of the vent is transmitted onto the furnace 22.

A particle feeding device or particle feeder 40 is mounted generally above the fluidized bed coater 20 and is designed to feed minute particles 41 into the coating enclosure at a desired rate. The particles from the feeder 40 enter the coater through an entrance conduit 42 which extends downward through the wall of the upper stack 27 that terminates in a frustoconical lower surface 37 adjacent its lower end which mates with the upper end of the furnace tube 26. The particle feeding device 40 is coupled to the entrance conduit via a slidable linkage 43 whereby the weight of the particle feeding device 40 is substantially not transmitted to the coating enclosure. Instead, the weight of the particle feeding device 40 and of particles contained therein (not shown) are substantially transmitted to a support 39. A suitable induction or alternating current heating coil 44, as is well known in this art, is included as a part of the annular heating section 21, and it is disposed in surrounding relationship to the outer quartz tube 24 in order to heat the inner susceptor tube 23 and thereby heat the active deposition region of the coating enclosure together with the small particles and the objects being levitated in order to bring them to the desired deposition temperature for coating.

The coating operation is carried out by establishing a levitated bed of minute particles, submillimeter in size, which is maintained in the lower region of the coating enclosure 29; this bed extends into the conical region defined by the upper surface 30 of the nozzle 28 (sometimes referred to as the conical bottom surface 30 of the enclosure). Once the bed is established, one or more objects to be coated, such as annular valve bodies or occluders for prosthetic heart valves, are appropriately loaded into the bed through the upper exit passageway 36; once in the bed, they will be supported among the fluidized particles by the upwardly flowing gaseous stream flowing through the passageway 32. The bed of particles and the objects to be coated are then appropriately heated to raise their temperature to the desired coating temperature by applying an appropriate amount of electrical power to the heating coil 44. Electrical power is applied to the heating coil 44 at about 10,000 cycles per second, inductive coupling between the thin inner susceptor tube 23 and the heating coil 44 which causes the skin temperature of the thin inner susceptor tube 23 to rise, thereby raising the temperature within the coating enclosure 29. The temperature within the coating enclosure 29 is appropriately monitored and controlled, as is well known in this art, using either electrical (e.g. thermocouple) or optical temperature-measuring devices, the latter of which could be effected through a viewing port (not shown).

The upwardly flowing gas stream, during the time of coating, is made up of a mixture of an inert fluidizing gas plus a carbonaceous substance, such as a gaseous hydrocarbon, for example methane, ethane, propane, butane, acetylene, propylene or mixtures thereof, or some other suitable carbon-containing substance that is either gaseous or easily vaporizable, as is well known in this art. If it is desired that the substance being deposited is not 100 percent pyrocarbon but instead is an alloy, for example, of silicon carbide and pyrocarbon, a desired amount of an appropriate source of silicon, such as methyltrichlorosilane, is also included in the levitating-coating gas mixture, and such may be preferred. Illustrated in FIG. 1 is a source of hydrocarbon 46 which is provided with a flow-regulating valve arrangement 48 alongside a source of inert gas 50, for example argon, helium or nitrogen which is likewise equipped with a suitable flow-regulating valve arrangement 52. These two sources of gas flow into a flexible common line 54 which leads to the central passageway 32 in the lower nozzle 28.

The total flow of levitating-coating gas upward through the coating enclosure is regulated so that the fluidized bed occupies a region generally near the conical bottom surface 30 of the enclosure. The upward flow of the gaseous atmosphere through the central passageway 32 causes a generally toroidal flow pattern to be established within the lower region of the fluidized bed, which in the illustrated arrangement is partially defined by the conical surface 30 of the nozzle 28, with the minute particles traveling upward in the central region and then downward generally along the outer perimeter thereof. However, other arrangements might be used, such as flat-bottomed coating enclosures where the gas mixture enters via a porous frit or a drilled plate, as generally known in this art.

The particles may be chosen so as to have a density greater than the density of the substance being deposited in the bed. When pyrocarbon is to be deposited, or pyrocarbon alloyed with a minor amount of silicon carbide, particles of materials having a density of at least about 3 grams/cm$^3$, and preferably from about 4 to about 5.5 gm/cm$^3$, are used. Examples include refractory oxides, such as alumina, alumina-silica (e.g. mullite) and dense zirconium oxide, e.g. ZrO$_2$ having a density greater than about 5 grams per cm$^3$ and a mullite of a density of about 3.2 gm. per cm$^3$. As such particles are coated, the overall density of the composite or coated particles will gradually become less as they increase in size. In general, the smaller uncoated particles tend to sink to the lower portion of the bed, while the less dense composite particles having a greater thickness of coating are generally levitated higher and reside in the upper portion of the bed. The particles employed should be about 1,000 microns or less in size. The particles added during the coating run should have an average size not greater than about 400 microns and may be made up of particles between 300 and 425 microns, and the average size of the particles withdrawn should be at least about 500 $\mu$m.

To remove particles from the bed, an exit conduit 56 is provided having an opening of suitable diameter in its upper end. The conduit 56 can extend through the entire lower nozzle 28, or it can be shorter in length and be received in a coaxial counterbore provided at the upper end of a drilled passageway, so as to protrude from the conical surface 30 of the nozzle 28. The exit conduit 56 is preferably capped at its upper end and has an exit hole 57 in its sidewall. The conduit 56 may be proportioned so that its upper end terminates within the vertical region defined by the conical surface 30, and preferably, the conduit 56 protrudes from the conical surface 30 a maximum vertical distance of less than about 1 inch for a coater having an interior diameter of about 4 inches or less. The exit conduit 56, which extends into the coating region, is formed of a suitable refractory material, such as graphite or mullite.

Particles from the fluidized bed which enter the conduit 56 through the hole 57 fall downward by gravity to a discharge conduit 60 leading to a collection chamber 62 where they are received in a graduated cylinder or beaker 63 or the like so that the total amount and/or volume of particles removed can be determined at any time either optically or through the use of a load cell 92. The collection chamber 62 is pressurized with inert gas from a suitable source 66 which is precisely controlled through the use of a flow-regulating valve arrangement 68 that is remotely controlled, as discussed in more detail hereinafter, and fills the chamber with argon or nitrogen at the desired pressure via flexible conduit 69. The flow of inert gas out of the pressurized collection chamber 62 upward through discharge conduit 60 and the exit conduit 56 not only serves as a purge flow to prevent substantial quantities of dust from falling into the collection chamber, but it also serves to precisely regulate the rate of removal of particles from the fluidized bed, as more particularly discussed in U.S. Pat. No. 3,977,896. Generally, by appropriately increasing the pressure within the collection chamber 62, the rate of upward flow of inert gas will increase, with a resultant decrease in the rate of withdrawal of particles from the bed.

It has been found that the size of the fluidized particle bed within a coating enclosure in the region where the coating deposition is occurring may be the most important parameter in precisely controlling the character of the pyrocarbon being deposited. Problematically, whenever such submillimeter particles are being coated in a fluidized bed, the total surface area of the particles begins to increase significantly as the diameters of the pyrolytic carbon-coated particles grow. This change in the available deposition surface area in the fluidized bed will result in a change in the physical characteristics of the pyrolytic carbon being deposited if the other coating variables are held constant, e.g., coating temperature, gas flow rate and gas composition; and moreover, when the bed reaches some maximum size, it will collapse and thus limit the thickness of the carbon coating that can be deposited on levitated substrates under constant conditions. Changes in the physical characteristics of the carbon deposited may be undesirable for any of a number of reasons.

It has been found that pyrolytic carbon having good structural strength and uniform physical properties can be deposited as relatively thick coatings upon relatively large objects in the accompaniment of particles if the available fluidized bed surface area is maintained relatively constant by withdrawing particles which have become enlarged in size as a result of coating and feeding smaller size particles into the deposition enclosure. Although various of the conditions in the coater can be easily regulated, the surface area to volume ratio is inherently subject to constant change because there is a continuous gradual increase in the total surface area as the items being coated grow in size as the result of the deposition thereupon. Advantageously, the present invention addresses this problem and others.

Accordingly, a desired surface area to volume ratio is initially provided by starting with an appropriate amount of particles of a particular average size to constitute the fluidized bed. Preferably, an initial surface area to volume ratio is provided near the lower end of the range that produces crystalline pyrolytic carbon having the physical properties desired. Thereafter, as the growing thickness of the deposited pyrolytic carbon layers causes the total surface area to increase, withdrawal of some of the coated particles is initiated so as to decrease the total number of particles to thereby maintain a specific surface area or to regulate its increase in a controlled manner. Thereafter, replacement of the particles being withdrawn with particles of much smaller size is begun.

In order to precisely monitor the size of the fluidized bed and to control the withdrawal of the particles in response to the precisely monitored bed size, the signal from a load cell 78 is sent through a suitable line 84 to a control unit 86. The control unit 86 compares the signal being received with a value programmed into its memory to see if a desired weight change pattern is being maintained, and if it is not, the control unit 86 instigates appropriate adjustments to the valve 68 and/or the particle feeding device 40. Thus, adjustments in the bed size can be made either by changing the rate of particle feed to the bed or by changing the rate of removal of particles from the bed. Accordingly, the control unit 86 is connected by a suitable line 88 through which a signal, e.g. electric, pneumatic, etc., is transmitted to the particle feeder 40 and by a similar line 90 leading to the valve 68, which determines the rate of flow of inert gas upward through the particle exit/discharge conduit 56, 60. It is convenient to set the particle feeder to feed particles of a desired size into the coater 20 at a substantially constant rate, so that the changes in bed size in response to the weight change monitored are preferably carried out by either increasing or decreasing the rate of withdrawal of particles from the bed. Although a load cell 78 is the preferred device for monitoring the weight of the bed, other suitable weight-sensing devices can be employed.

Because the arrangement shown in FIG. 1 is such that the load cell 78 is subject to the weight of the withdrawn particles 61, and because an increase in such weight is not indicative of an increase in the weight of the fluidized bed maintained in the coating apparatus 20, a load cell 92 is preferably provided under the beaker 63 into which the withdrawn particles 61 fall. The load cell 92 is connected by a suitable line 94 to the control unit 86 and provides a signal which is indicative of the total weight of the beaker 63 and the particles 61. The control unit 86 is capable of comparing the weight signals from the load cell 92 with the weight signals from the load cell 78. As a result, the control unit 86 is able to subtract from the increase in weight, as detected by the load cell 78, the increase in such weight that is attributable to the withdrawn particles 61, thereby excluding such attributable increases from the determination of the fluidized bed size.

In addition, the control unit 86 is capable of comparing the weight signals from the load cell 92 versus time, thereby determining the precise amounts of particles removed during each desired interval of time, for example, each minute or one-half minute. Accordingly, the employment of such a load cell 92 provides a further check to determine whether modulation of the rate of flow of nitrogen upward through the particle exit conduit 56 is having the desired effect, and as a result it permits prompt adjustments to be made in the nitrogen pressure to fine-tune the rate of removal of particles to that desired in order to obtain the precise weight changes in the fluidized bed programmed for a particular time period in a coating run.

In the same vein, the control unit 86 can be programmed to account for any pyrolytic carbon or soot that may deposit, e.g., in the exit passageway 36. As such carbon or soot deposits in the exit passageway 36, the increased weight in the exit passageway 36 is measured by the load cell 78 along with the changing weight of the fluidized bed. Like the increasing weight of the withdrawn particles 61 discussed above, an increase in weight in the exit passageway 36 due to pyrolytic carbon or soot deposits is not indicative of an increase in the weight of the fluidized bed. However, unlike the increasing weight of the withdrawn particles, the increasing weight in the exit passageway 36 can be accurately approximated by the control unit 86 without the need for an additional load cell to measure such increase. Thus, the control unit 86 accounts for any increased weight of, e.g., the exit passageway 36 caused by the deposition of pyrolytic carbon or soot in the exit passageway 36.

Any suitable electronic controller can be used as the control unit 86, such as one commercially available from Inotek/Analog Devices, a UDC 9000 MULTI-PRO from Honeywell, or an IBM 286 computer and Control E.G. software. The control unit 86 is preferably capable of being programmed so as to establish different bed conditions over the length of a coating run, and such programmable features are available in commercial controllers. For example, the unit may include a microcomputer that can be programmed so as to employ a relatively large bed size at an early stage of a particular coating run so as to deposit pyrocarbon more slowly and better cover inside corners and then to gradually decrease the bed size during a later stage in the run so as to increase the rate of pyrocarbon deposition. If desired, additional changes can be programmed to be made so as to gradually increase bed size near the end of a coating run to compensate for the growing mass of the objects being coated or to, for some reason, alter the characteristics of the coating being deposited on a particular substrate for which a different character of pyrocarbon is desired at different regions throughout its depth, perhaps even alternating characteristics near the ultimate exterior surface, if desired, for a particular purpose. Moreover, by monitoring the weight difference and making such changes in bed size as necessary, utilizing the input from the load cell 92 to assure the desired rate of withdrawal is being achieved, the rate at which pyrocarbon or some other substance is deposited can be very carefully controlled, and as a result of such control, the precise thickness of the coating that has been deposited during the run can be determined. In this manner, it is possible to repeatedly coat particular objects with coatings of a desired thickness to a precision of within about 1 mil (0.001 inch). This is a particularly valuable advantage of the invention when coating parts, such as parts for prosthetic heart valves, wherein precision in achieving tolerances can be extremely important.

Should a fluidized bed grow too small, it will no longer properly levitate the objects being coated, and there is danger that the entire bed will collapse, interrupting the coating process and likely resulting in a rejection of the objects being coated from the standpoint of quality control. By employing the present invention, such a collapse of a fluidized bed can be positively prevented because any tendency of a fluidized bed to grow too small will be promptly detected as soon as it begins, and countermeasures are automatically taken by the control unit so as to return the bed to its desired size, usually by slowing the rate of removal of particles from the bed so that its size will gradually increase until the desired size bed is re-established. On the other hand, if a bed were to grow excessively large, not only would the characteristics of the pyrocarbon being deposited undesirably change, but the rate of deposition would slow, with the result that, after a predetermined time of deposition, a thinner coating than expected would have been deposited upon the objects being coated, with the pyrocarbon deposited being generally less in hardness than that deposited upon the parts in a smaller bed. Accordingly, it can be just as important to prevent a bed from growing oversize, and the invention can also positively prevent this by having the control unit 86 increase the rate of removal of particles from the bed should it be determined that the bed size is undesirably increasing.

In order to assure the most accurate possible weight change measurements, it is desirable to minimize the total weight to which the load cell 78 is subjected. Thus, as mentioned before, the particle feeder 40 is substantially independently supported by support 39, and it is coupled to the upper stack 27 via a slidable coupling 43, which transmits substantially none of the weight of the particle feeder 40. Similarly, the annular heating section 21, including the outer quartz tube 24, the inner susceptor tube 23, the insulation 25 and the heating coil 44, is substantially supported by an independent support 74. The coating enclosure 29 is thus arranged to "float" vertically within the outer annular heating section 21. The coating enclosure is supported upon a cooling plate 77 that is mechanically coupled to a standpipe 71 via a gas tight mechanical coupling 72. The standpipe 71 serves as a common gas flow passageway that couples the common line 54 to the central passageway 32. The standpipe 71 is mechanically coupled to and supported by a frame structure 58 using keeper rings 76a and 76b. The cooling plate 77 is positioned within a circular opening in a lower plate 75 that supports the outer quartz tube 24 and the inner susceptor tube 23, and it is sealed thereto by a non-load bearing gas tight seal 73. Advantageously, the gas tight seal 73 prevents atmospheric oxygen, from leaking into the region (or duct) between the furnace tube 26 and the graphite inner susceptor tube 23 during the high-temperature coating process where oxidation would occur. The duct is typically 0.040" in radial width. Thus, the heaviest part of the furnace 22 is independently supported, and the load cell 78 bears substantially only the weight of a separate floating body consisting of: the furnace tube 26 (including its associated components, e.g., the upper stack 27, the lower nozzle 28, the fluidized particles and substrates, the exit conduit 56, and the cooling plate 77), the standpipe 71, the frame structure 58, the collection chamber 62, the beaker 63, the withdrawn particles 61, and the smaller load cell 92.

Similarly, the smaller load cell 92 bears substantially only the weight of the beaker 63 and the withdrawn particles 61. Advantageously, this arrangement, whereby the weights to which the load cells are subjected are minimized, allows for maximum precision in measuring the weight change of the fluidized bed and the weight of the withdrawn particles 61, respectively.

Referring next to FIG. 2, a partial schematic view of the fluidized bed apparatus 20 is shown in section. The bottom of the nozzle 28 is shown resting upon the cooling plate 77, which is coupled to the standpipe 71 via the mechanical coupling 72. The inner susceptor tube 23 and the rest of the annular heating section 21 of the furnace are shown resting upon the lower plate 75. As noted above, the cooling plate 77 is coupled to the lower plate 75 via the non-load bearing gas-tight seal 73. Advantageously, the non-load bearing gas-tight seal 73 provides a slow purge flow of nitrogen gas 79, e.g. about 1 liter per minute, that flows upwardly between the tube 26 and the inner susceptor tube 23, as indicted by the upwardly pointing arrows. The slow upward flow of gas travels between the furnace tube 26 and the inner susceptor tube 23 until it reaches the top of the annular heating section 21 where it is released into the atmosphere. Thus, a positive purge gas pressure is created between the furnace tube 26 and the inner susceptor tube 23, thereby preventing atmospheric gases, e.g., oxygen, from entering this space between where it could oxidize heated graphite components of the coater 20.

As an example of operation of a fluidized bed coating apparatus embodying various features of the invention, a fluidizing flow of an inert gas, such as nitrogen, is established upward through the coater 20 by opening the valve 52 and setting it to supply nitrogen from the source 50, which may be a pressurized tank or the like. Advantageously, the control unit 86 can be used to effectuate the opening of the valve 52, e.g., in response to the execution of a control program. A suitable charge of particles is then added to the coater, through the upper end, to create a fluidized bed. For example, in a coater having an internal coating enclosure diameter of about 3½ inches one may begin with a charge of about 250 to 500 grams of pyrocarbon-coated zirconium dioxide particles having sizes greater than about 325 microns but less than about 700 microns. The particles of this initial bed are pyrocarbon-coated versions of the uncoated zirconia particles that will subsequently be fed into the bed during coating, having a density of about 5.37 grams per cc and a size ranging from about 300 microns to about 425 microns (with an average size of about 360 microns), which uncoated particles are loaded into the particle feeder 40. For a typical coating operation in a coater of about this size, about 20 to 40 orifice rings are added to the bed; such rings, when coated, will serve as valve bodies for prosthetic heart valves. Exemplary orifice rings generally have the form of short tubes, having a height of about 0.7 cm., an I.D. of about 1.5 to 2.5 cm. and an O.D. of about 1.6 to 2.6 cm.

The apparatus is then brought up to its operating temperature of between about 1,200° and 2,000° C. so as to uniformly heat the particles and the objects to a desired temperature using the heating coil 44. Typically, the temperature is maintained at about 1,320° C. During this warmup period, a fairly high flow of nitrogen is maintained upward through the particle withdrawal conduit 56, which has an entrance aperture or hole 57 in the form of a 3/16 inch circle. In this coating apparatus, the exit conduit 56 is located so that its exit hole 57 is located about 0.4 inch below the top edge of the conical surface 30 of the nozzle 28 in about the middle of the bed. The bed itself occupies a volume of about 17 cubic inches within the coating enclosure, and the conical surface of the nozzle 28 extends for a vertical distance of about 5 inches. In the illustrated embodiment, the exit hole 57 is located at a level of about 2.5 inches above the bottom of the bed where the total depth of the bed is about 4.0 inches, so that it is located in the lower one-half of the volume of the bed because of the conical configuration.

When coating is ready to begin, the valve 48 is opened, and flow of a suitable coating gas, such as propane, is added to the fluidizing gas that is already flowing through the flexible common line 54 and the central passageway 32. As with the valve 52, the valve 48 may be opened by the control unit 86. In order to provide some alloying of the pyrocarbon being deposited with silicon carbide, methyltrichlorosilane is preferably added to the gas stream from a suitable source (not shown) as is well known in this art. The flow rate of the inert gas is adjusted, as necessary, so that the flow of the fluidizing-coating gas mixture upward through the coating enclosure, measured at standard temperature and pressure, is about 13 liters per minute nitrogen, about 7 liters per minute propane and about 6 grams per minute methyltrichlorosilane.

As soon as coating begins, the feeder 40 is caused to feed uncoated zirconia particles into the apparatus at the rate of about 2 grams per minute via the entrance conduit 42 through which they fall into and become a part of the fluidized bed. Because of their greater density, the small uncoated particles quickly gravitate to a lower level in the bed. A purge flow of about 4 liters of nitrogen per minute is maintained through the entrance conduit 42, flowing past the falling zirconia particles. The output signal from the load cells 78 and 92 is transmitted to the control unit 86, and it causes appropriate adjustments to be made in the rate of removal of particles through the exit conduit 56 so as to cause this weight change to follow a predetermined path for an extended period of time which constitutes the coating run. Nominally, the flow of nitrogen upward from the chamber 62 through the withdrawal conduit, which is about ¼ inch in internal diameter, is maintained at about 4 liters per minute, and such initially prevents the withdrawal of particles. Generally, the larger the particles are which make up a bed, the smaller will be the overall bed surface area for a particle charge of a given weight, and accordingly, it is desirable to remove the larger particles from the bed and constantly replace them with the smaller uncoated particles that are being continuously added. Moreover, if the total bed surface area decreases significantly, the coating rate will increase and can result in the production of coatings having more entrapped soot that are more difficult to polish; thus, it is also important to avoid too small a bed. As a result, the flow of $N_2$ upward through the conduit 56 and out through exit hole 57 located in the sidewall thereof facing the centerline of the enclosure is modulated by the control unit 86 to effect a removal rate of about 6 to 8 grams of particles per minute.

At the conclusion of coating and cool-down, the coated articles are examined, and the SiC-alloyed pyrocarbon is found to be of high quality and to have a uniform thickness of about 0.010 inch, which varies by less than about 0.001 inch from the desired thickness.

Very generally, methods and apparatus are provided which allow the very precise control of the deposition of a substance, such as pyrocarbon, onto a substrate being levitated in a fluidized bed of particles. Through the mechanism of monitoring the weight change of the fluidized bed, an extremely accurate measure of the bed size is obtained, which is then used as input to a control unit to make changes as necessary so as to achieve and maintain a preselected bed size within the coating enclosure, or if desired, to carry out a preselected program of varying bed size throughout the duration of a coating run.

Although the invention has been described with regard to certain preferred embodiments, it should be understood that various changes and modifications as would be obvious to one having the ordinary skill in this art can be made without departing from the scope of the invention which is defined solely by the claims appended hereto. For example, although the description has dealt with the deposition of pyrocarbon or silicon carbide alloyed pyrocarbon, other carbide alloying materials can be used, for example, zirconium carbide or tungsten carbide, or other substances could be deposited from a vaporous atmosphere, e.g. 100 percent SiC.

Particular features of the invention are emphasized in the claims which follow.

What is claimed is:

1. A method of carefully controlling the deposition of a substance onto a substrate while being levitated in a fluidized bed of particles, said deposition being carried out in an enclosure through which a gaseous atmosphere is caused to flow upward, which method comprises
   (a) establishing a bed of particles in fluidized condition in said enclosure with at least one substrate to be coated being levitated within said fluidized bed, said levitation being effected by the upward flow of said gaseous atmosphere,
   (b) heating said particles and said substrate to an operating temperature and including a pyrolytically-decomposable component within said gaseous atmosphere such that pyrolysis of said component occurs to cause a pyrolytic substance to be deposited at said operating temperature upon said substrate and upon said particles, both of which are being levitated,
   (c) withdrawing particles from said bed in a controlled manner,
   (d) adding feed particles to said bed in a controlled manner, which feed particles have an average size that is less than the average size of the particles being withdrawn,
   (e) monitoring the weight of said bed to determine changes in the weight of said bed over a period of time, and
   (f) altering either the rate at which particles are withdrawn from said bed or the rate at which particles are added to said bed or both in response to said determined weight changes so as to precisely regulate deposition rate over time and thereby produce a precise pyrolytic coating upon said substrate being coated.

2. A method according to claim 1 wherein said gaseous atmosphere pyrolytically-decomposable component comprises a hydrocarbon which decomposes to deposit pyrocarbon, said gaseous atmosphere also including a major portion of an inert gas and a minor portion of an organic silicon compound, which compound decomposes at said operating temperature to deposit silicon carbide alloyed with said pyrocarbon.

3. A method according to claim 1 wherein step (e) includes:
   initially weighing at least a portion of said enclosure wherein said bed is established such that said bed is weighed along with said at least a portion of the enclosure;
   periodically reweighing said at least a portion of the enclosure at desired intervals so as to determine periodic changes in the overall weight of said at least a portion of the enclosure over said intervals; and
   determining changes in weight of said bed over said intervals based on changes in the overall weight of said at least a portion of the enclosure.

4. A method according to claim 3 wherein said determining step includes the step of subtracting from said overall weight of said at least a portion of the enclosure a deposit factor, said deposit factor being an approximation of the weight of pyrolytic material deposited onto said at least a portion of the enclosure after said initial weighing so that compensation is made for the weight of the material deposited onto said at least a portion of the enclosure in determining said change in weight of said bed.

5. A method according to claim 4 wherein said determining step includes the steps of measuring a withdrawn particle weight that is the weight of the particles withdrawn from said bed in step (c).

6. A method according to claim 5 wherein said overall weight of said at least a portion of the enclosure is measured using a load cell.

7. A method according to claim 6 wherein said withdrawn particle weight is measured using a load cell.

8. A method according to claim 1 wherein particles are substantially continuously added to the bed at a substantially constant rate, and wherein the rate at which particles are being withdrawn from said bed is altered in response to said weight change of said bed being determined.

9. A method according to claim 8 wherein the rate of withdrawal of particles from said fluidized bed is controlled by changing the rate of flow of an inert gas stream that is caused to flow upward in opposition to gravity flow of said particles being withdrawn.

10. A method of carefully controlling the deposition of a pyrocarbon onto a plurality of substrates while they are being levitated along with a fluidized bed of particles, which method comprises
    establishing a bed of particles in fluidized condition in a coating zone along with said plurality of substrates to be coated, wherein the bed of particles and the substrates are levitated by the upward flow of a gaseous atmosphere,
    heating said particles and said substrates to pyrolysis temperature, a carbonaceous pyrolytically-decomposable component being included within said gaseous atmosphere such that pyrolysis of said component occurs to cause pyrocarbon to be deposited upon said substrates and upon said particles, monitoring the weight of said bed to determine changes in the weight of said bed over time, and
    adjusting the amount of particles within said bed in response to said determined weight changes so as to precisely regulate deposition of pyrocarbon over time and thereby produce a precise coating upon said substrates.

11. Apparatus for depositing a pyrolytic substance on a substrate while it is being levitated in a fluidized bed of particles, which apparatus comprises
    a coating enclosure,
    means for flowing a gaseous mixture upward through said enclosure to maintain a bed of particles in fluidized condition in said enclosure and levitate at least one substrate to be coated within said fluidized bed,
    heating means for maintaining said substrate and said fluidized bed of particles at a temperature so that pyrolysis of a component of said gaseous mixture occurs in said fluidized bed to cause the pyrolytic substance to be deposited upon said substrate and upon said particles, means for withdrawing particles from said fluidized bed, means for adding particles to said fluidized bed having an average size that is less than the average size of the particles being withdrawn therefrom, means for monitoring the weight of said fluidized bed so as to determine changes in the weight of said fluidized bed, and means for changing the rate at which particles are withdrawn from said fluidized bed or the rate at which feed particles are added to said bed or both in response to said weight changes so determined, whereby deposition upon said substrate being coated is precisely regulated over time.

12. Apparatus according to claim 11 wherein said rate-changing means is a control unit which adjusts said particle-withdrawing means to change the rate at which particles are withdrawn, and wherein said particle-adding means supplied particles to said bed at a substantially constant rate.

13. Apparatus according to claim 12 wherein said monitoring means includes a load cell which generates a signal means that is transmitted to said control unit.

14. Apparatus according to claim 11 including:
a body comprising said coating enclosure wherein said fluidized bed is maintained, wherein said heating means surrounds said body but is mechanically decoupled therefrom, means mechanically interconnecting said body and said monitoring means so that the entire weight of said body is transmitted to said monitoring means;

whereby substantially the entire weight of said heating means is supported independently of said body, which is mechanically interconnected to said monitoring means.

15. Apparatus according to claim 14 wherein said separate floating body is interposed coaxially within said heating means.

16. Apparatus according to claim 15 wherein said separate floating body engages said heating means at a lower junction, said junction including a gas tight seal.

17. Apparatus according to claim 16 wherein said gas tight seal includes a flexible, inflatable annular seal.

18. Apparatus according to claim 17 including means for flowing purge gas through into a duct that is defined between said separate floating body and said heating means.

19. Apparatus according to claim 14 wherein said weight-monitoring means includes a first load cell that weighs said floating body.

20. Apparatus according to claim 19 wherein said weight-monitoring means includes a second load cell that weighs particles withdrawn from said fluidized bed.

* * * * *